(12) United States Patent
Lee

(10) Patent No.: US 6,743,368 B2
(45) Date of Patent: Jun. 1, 2004

(54) NANO-SIZE IMPRINTING STAMP USING SPACER TECHNIQUE

(75) Inventor: Heon Lee, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 150 days.

(21) Appl. No.: 10/062,952

(22) Filed: Jan. 31, 2002

(65) Prior Publication Data

US 2003/0141276 A1 Jul. 31, 2003

(51) Int. Cl.[7] ................................................. B32B 3/00
(52) U.S. Cl. ...................... 216/2; 11/12; 11/13; 11/38; 11/41; 428/156; 428/167; 428/168; 428/170
(58) Field of Search ................................. 216/2, 11, 12, 216/13, 38, 41; 428/156, 167–170

(56) References Cited

U.S. PATENT DOCUMENTS

| | | | |
|---|---|---|---|
| 5,772,905 A | | 6/1998 | Chou |
| 5,875,071 A | | 2/1999 | Erpelding et al. |
| 6,069,380 A | | 5/2000 | Chou et al. |
| 6,117,344 A | | 9/2000 | Cox et al. |
| 6,309,580 B1 | | 10/2001 | Chou |
| 6,365,059 B1 | * | 4/2002 | Pechenik ..................... 216/52 |
| 6,432,740 B1 | * | 8/2002 | Chen .......................... 438/99 |
| 6,482,742 B1 | * | 11/2002 | Chou ......................... 438/690 |
| 6,517,995 B1 | * | 2/2003 | Jacobson et al. ........... 430/320 |
| 6,518,189 B1 | * | 2/2003 | Chou ......................... 438/706 |
| 6,518,194 B2 | * | 2/2003 | Winningham et al. ...... 438/717 |

OTHER PUBLICATIONS

Roller nanoimprint lithography Hua Tan, Andrew Gilbertson, & Stephen Y Chou @ 1998 american Vacuum Society J Vac Sci Technol. B 16(6), Nov./Dec. 1998, p. 3926.

Large area high density quantized magnetic disks fabricated using nanoimprint lithography Wei Wu, Bo Cui, Xiao-yun Sun, Wei Zhang, Lei Zhuang, Linshu Kong and Stephen Y Chou @ 1998 american Vacuum Society J Vac Sci Technol. B 16(6), Nov./Dec. 1998, p. 3825.

Multilayer resist methods for nanoimprint lithography on nonflat surfaces Ziaoyun Sun, Lei Zhuang, Wei Zhang, and Stephen Y Chou @ 1998 american Vacuum Society J Vac Sci Technol. B 16(6), Nov./Dec. 1998, p. 3922.

Pillars in Perfect Order By Steven Schultz Princeton Weekly Bulletin, Nov. 22, 1999, vol. 89, No. 20.

Esprit Project 28785—Nanotect Development of Nanoimprinting technique suitable for large area mass production of nm–scale patterns Dr Lars Montelius, Lund University Dept of physics Professorsgatan.

Researchers Seek Workable Techniques for Nanoelectronics By Chappell Brown, EE Times Jan. 17, 2001 url: http://www.eetimes.com/story/oeg20010117S0071.

Big Push onA Nano Scale By Chappelle Brown, EE Times, Issue 1150, Monday Jan. 22, 2001.

A Self–Aligned Offset Polysilicon Thin–film Transistor Using Photoresist Reflow Jung–In Han and Chul–Hi Han IEEE Electron Device Letters, vol. 20, No. 9, Sep. 1999.

* cited by examiner

*Primary Examiner*—Nadine G. Norton
*Assistant Examiner*—Binh X. Tran
(74) *Attorney, Agent, or Firm*—Trueman H. Denny, III

(57) ABSTRACT

A wide-area nano-size imprinting stamp is disclosed. The wide-area nano-size imprinting stamp includes a substrate having a base surface upon which is formed a plurality of micro-features. Each micro-feature includes a plurality of spacers disposed on opposed side surfaces thereof. The spacers extend laterally outward of the opposed side surfaces and the micro-features and the spacers extend outward of the base surface. The micro-features and the spacers are selectively etched to differing heights to define an imprint stamp having an imprint profile. The imprint stamps can be formed on substantially all of a useable area of the substrate and can have complex shapes that vary among the imprint stamps. The imprint stamps can be used as a template for transferring the imprint profile to a mask layer in which the imprint profile will be replicated.

14 Claims, 14 Drawing Sheets

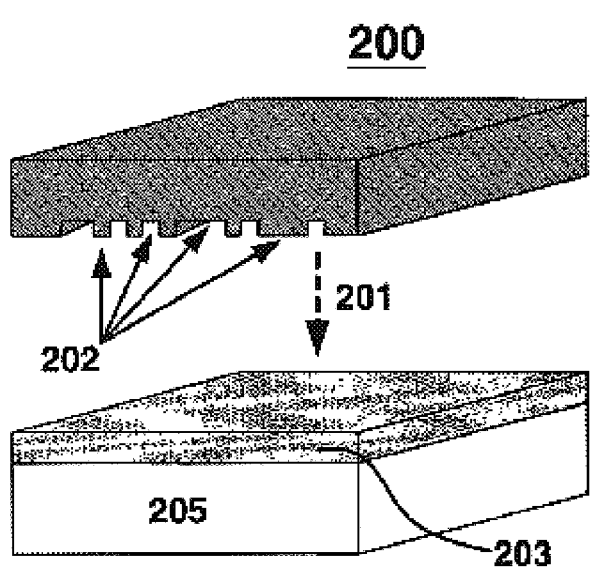
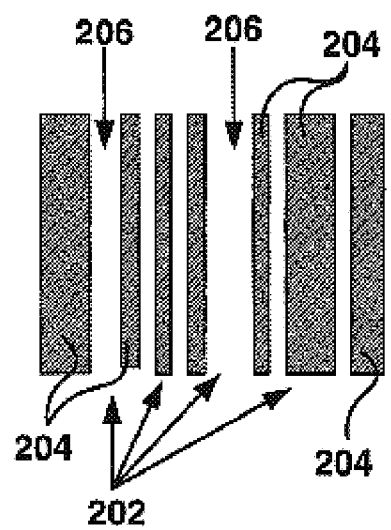
FIG. 1a (Prior Art)
FIG. 1b (Prior Art)
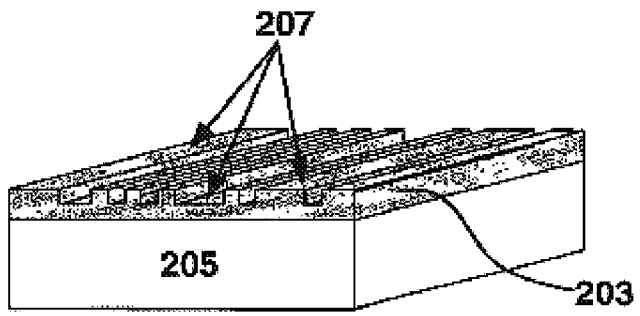
FIG. 2 (Prior Art)
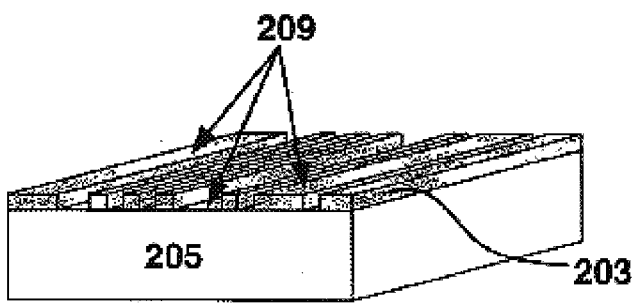
FIG. 3 (Prior Art)

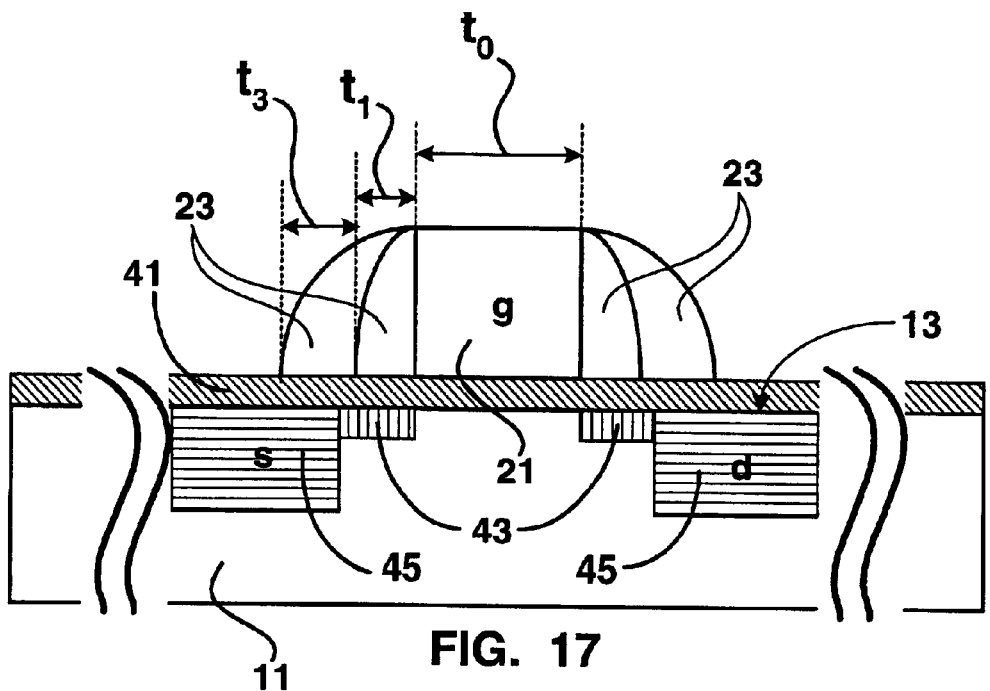
FIG. 17
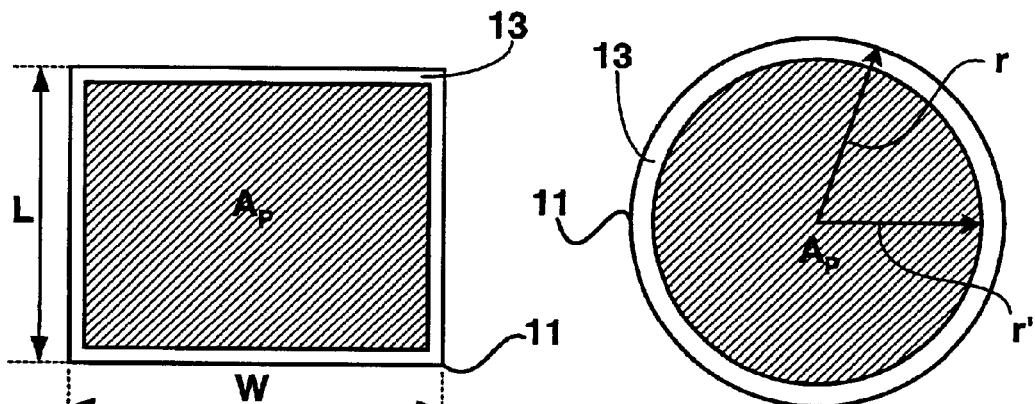
FIG. 18a
FIG. 18b
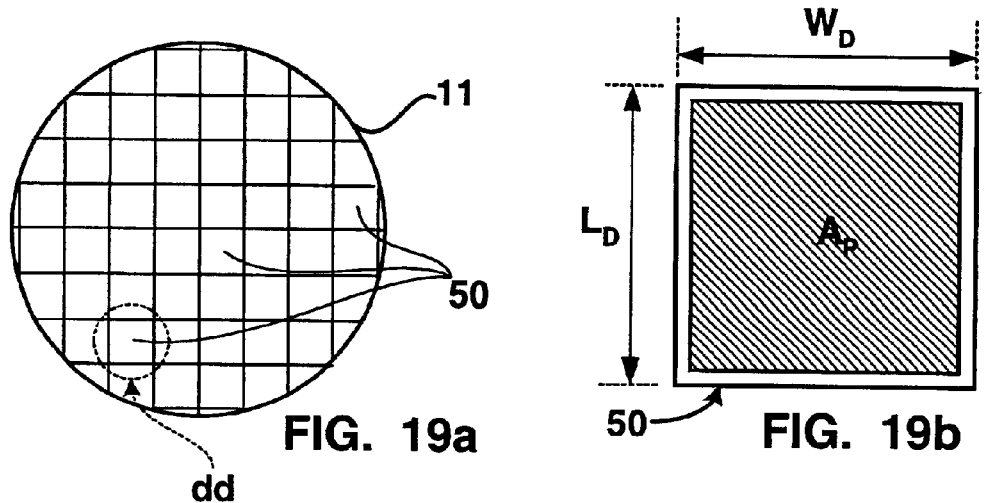
FIG. 19a
FIG. 19b

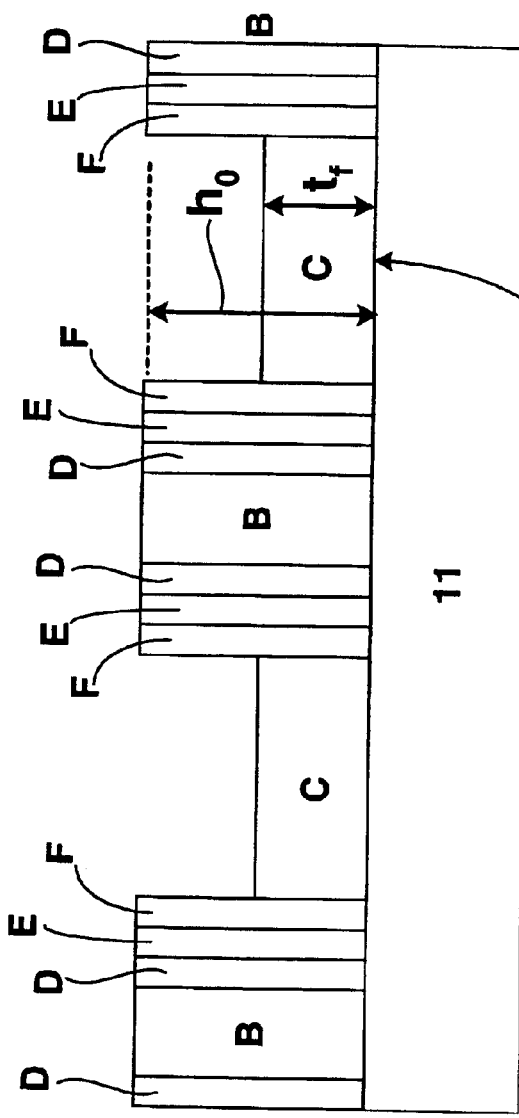
FIG. 20
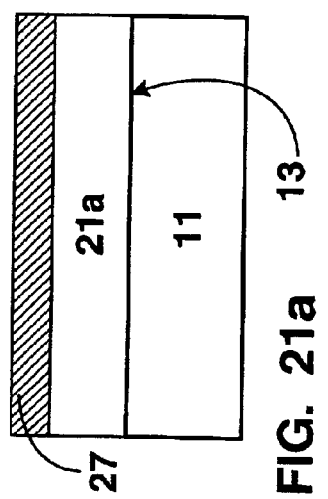
FIG. 21a
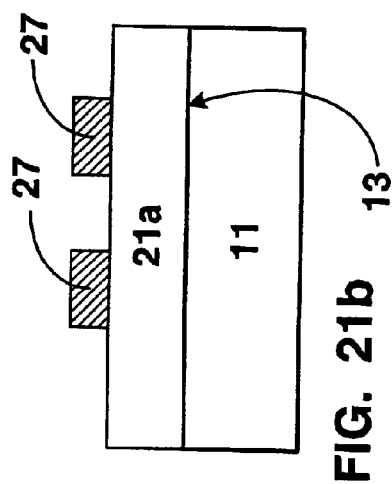
FIG. 21b
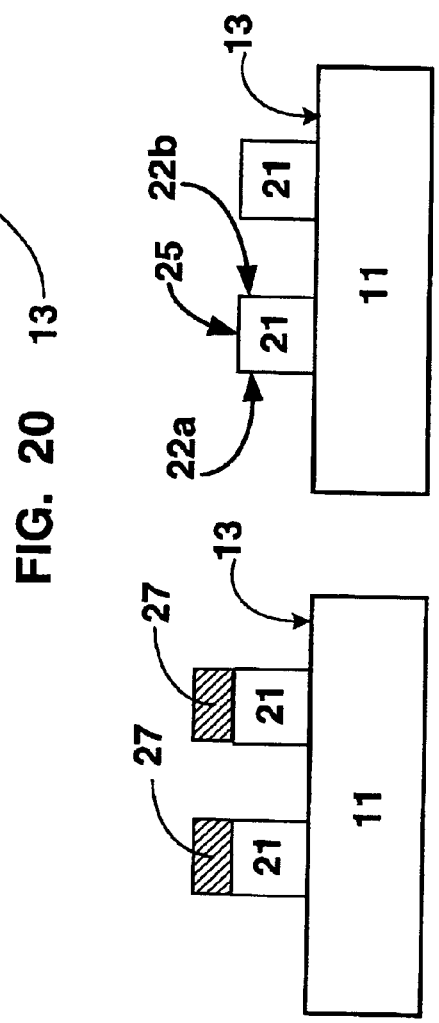
FIG. 21c
FIG. 21d

NANO-SIZE IMPRINTING STAMP USING SPACER TECHNIQUE

FIELD OF THE INVENTION

The present invention relates generally to a structure and method of fabricating nanometer sized imprinting stamps using a spacer technique. More specifically, the present invention relates to a structure and method of fabricating nanometer sized imprinting stamps using a spacer technique, wherein the resulting imprinting stamps can occupy substantially all of a surface area of a substrate the imprinting stamps are formed on and wherein the imprinting stamps can have complex shapes that vary among the imprinting stamps.

BACKGROUND OF THE ART

Nano-imprinting lithography is a promising technique for obtaining nano-size (as small as a few tens of nanometers) patterns. A key step in forming the nano-size patterns is to first form an imprinting stamp that includes a pattern that complements the nano-sized patterns.

In FIG. 1a, a prior nano-imprint lithography process includes an imprinting stamp 200 having a plurality of imprint patterns 202 formed thereon. In FIG. 1b, the imprint patterns 202 consists of a simple line and space pattern having a plurality of lines 204 separate by a plurality of spaces 206 between adjacent lines 204. By pressing (see dashed arrow 201) the imprinting stamp 200 onto a specially designed mask layer 203, a thickness of the mask layer 203 is modulated with respect to the imprint patterns 202 (see FIG. 1a) such that the imprint patterns 202 are replicated in the mask layer 203.

Typically, the mask layer 203 is made from a material such as a polymer. For instance, a photoresist material can be used for the mask layer 203. The mask layer 203 is deposited on a supporting substrate 205. Using a step and repeat process, the imprinting stamp 200 is pressed repeatedly onto the mask layer 203 to replicate the imprint patterns 202 in the mask layer 203 and to cover the whole area of the mask layer 203.

In FIG. 2, after the step and repeat process, the mask layer 203 includes a plurality of nano-size impressions 207 that complement the shape of the imprint patterns 202. Next, in FIG. 3, the mask layer 203 is anisotropically etched (i.e. a highly directional etch) to form nano-sized patterns 209 in the mask layer 203. Typically, the supporting substrate 205 or another layer (not shown) positioned between the mask layer 203 and the supporting substrate 205 serves as an etch stop for the anisotropic etch. Alternatively, the mask layer 203 can serve as an etch mask for an underlying layer (see reference numeral 208 in FIGS. 7a through 7d) and the pattern of the nano-size impressions 207 is replicated in the underlayer by a subsequent anisotropic etch process.

In FIG. 4a, the formation of the imprint patterns 202 on the prior imprinting stamp 200 begins by depositing alternating layers of thin film material (211, 213) on a substrate 215 to form a multi-stacked thin film 210 that extends outward of the substrate 215. The multi-stacked thin film 210 is then sliced into a plurality of discrete segments $\Delta_S$ along a direction shown by dashed arrow S. For example, in FIG. 4b, the substrate 215 can be a wafer of semiconductor material upon which the multi-stacked thin film 210 is deposited. After all layers of the multi-stacked thin film 210 have been deposited, the wafer (i.e. the substrate 215) is then sliced to form the discrete segments $\Delta_S$.

In FIG. 5a, a discrete segment $\Delta_S$ includes a portion of the multi-stacked thin film 210 and a portion of the substrate 215. In FIGS. 5b and 5c, the discrete segment $\Delta_S$ is selectively etched to define the imprint pattern 202. Differences in etch rates between the alternating layers (211, 213) causes one of the layers to be etched at a faster rate than the other layer resulting in differences in height between the alternating layers (211, 213). Those differences in height define the imprint pattern 202.

One disadvantage of the prior imprinting stamp 200 is the imprint pattern 202 is formed on only a fraction of the useable area of the imprinting stamp 200 as illustrated in FIGS. 5b, 5c, and 6. The imprint pattern 202 occupies an imprint area $I_A$ that is substantially smaller than a non-patternable area $N_A$. As a result, only a fraction of the available area is utilized by the imprint pattern 202.

A second disadvantage of the prior imprinting stamp 200 is the imprint pattern 202 consists of simple line and space patterns (204, 206) as is illustrated in FIG. 6. Consequently, the resulting nano-size impressions 207 are also limited to simple line and space patterns because they complement the imprint pattern 202.

In FIG. 7a, the imprint stamp 200 is pressed 201 onto the mask layer 203 to replicate the simple line 204 and space 206 patterns of the imprint pattern 202 in the mask layer 203. In FIG. 7b, after the pressing step, the mask layer 203 includes the complementary nano-size impressions 207 replicated therein. As was noted above, the nano-size impressions 207 also have the simple line and space pattern denoted as 204' and 206' respectively.

In FIG. 7c, the mask layer 203 is anisotropically etched until the space patterns 206' are coincident with an upper surface 208' of an underlayer 208 and the line patterns 204' extend outward of the upper surface 208'. The line and space patterns (204', 206') will serve as an etch mask for a subsequent anisotropic etch step. Next, in FIG. 7d, the underlayer 208 is anisotropically etched through the mask created by the line and space patterns (204', 206') to define the nano-size patterns 209.

Another disadvantage of the prior imprinting process as illustrated in FIGS. 7a through 7d is that the imprint area $I_A$ and the non-patternable area $N_A$ of the imprint stamp 200 are replicated in the nano-size patterns 209 such that the only a small fraction of the available area of the substrate 205 is includes the nano-size patterns 209 as indicated by a patterned area $P_A$ and a large portion of the substrate 205 remains as an unpatterned area $U_A$. For example, the patterned area $P_A$ can be several microns and the unpatterned area $U_A$ can be several hundred microns or more.

Although, a step and repeat process can be used to repeatedly press the imprint pattern 202 over a larger area of the mask layer 203, that process can result in print defects caused by some of the material from the mask layer 203 adhering to the imprint patterns 202 or by wear to the imprint patterns 202 due to repeated pressing steps. Moreover, the step and repeat process does not address the limitations created by the aforementioned simple line and space patterns (204, 206).

Consequently, there exists a need for a nano-size imprinting stamp that can be formed over a large area. There is also a need for a nano-size imprinting stamp that can include complex patterns and shapes.

SUMMARY OF THE INVENTION

The nano-size imprinting stamp of the present invention solves the aforementioned disadvantages and limitations.

The wide-area nano-size imprinting stamp of the present invention includes a plurality of imprint stamps that can occupy substantially all of a useable surface area of a substrate thereby solving one of the disadvantages of the prior imprint stamps in which the imprint patterns were formed on only a fraction of the useable area available. The imprint stamps of the present invention have complex predetermined shapes that can vary among the imprint stamps so that the limitations of simple line and spaces patterns of the prior imprint stamps are solved. Moreover, the imprinting stamp of the present invention can be formed over a wide area so that the disadvantages associated with the non-patternable area of the prior imprint stamps are also solved.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1a and 1b are profile and top plan views respectively of a prior imprint stamp and prior imprint patterns.

FIG. 2 is a profile view of a prior mask layer with nano-size impression formed therein by the prior imprint stamp of FIG. 1a.

FIG. 3 is a profile view of the prior mask layer of FIG. 2 after an anisotropic etch step.

FIG. 17 is a cross-sectional view of a micro-feature and spacers formed using a process similar to a LDD process according to the present invention.

FIGS. 18a and 18b are top plan views of substrates in which the imprint stamps occupy substantially all of a useable area of the substrates according to the present invention.

FIGS. 19a and 19b are top plan views of a substrate that has been partitioned into a plurality of die and of a die in which the imprint stamps occupy substantially all of a die area of the die according to the present invention.

FIG. 20 is a cross-sectional view of an imprint stamp in which a filler layer has been selectively etched to a predetermined thickness according to the present invention.

FIGS. 21a through 21d are cross-sectional views depicting the formation of a micro-feature from a feature layer according to the present invention.

DETAILED DESCRIPTION

Figure 4A:
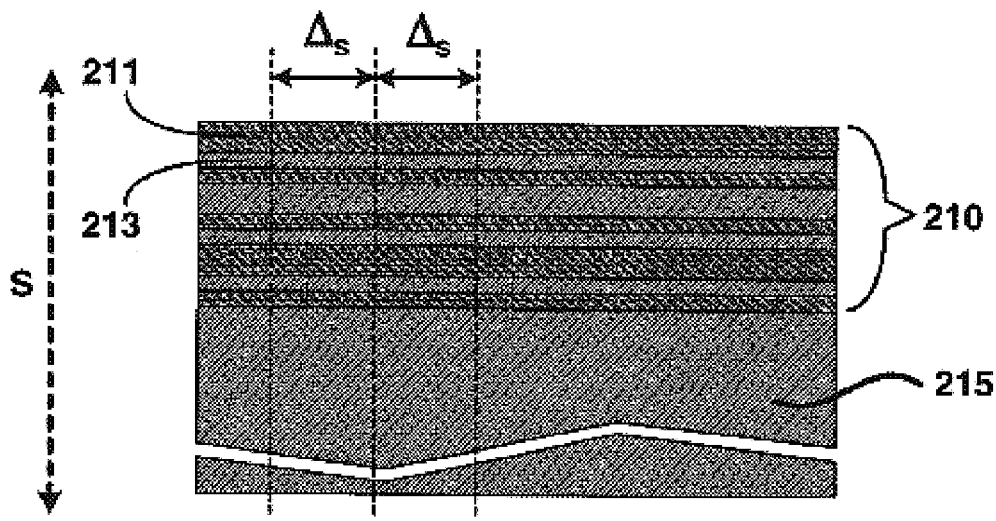
FIG. 4a is a cross-sectional view of a prior process for forming a prior imprint stamp.
Figure 5A:
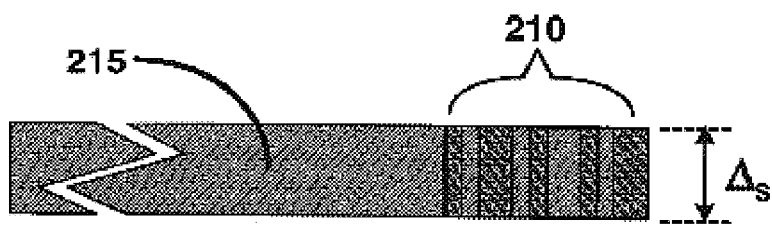
FIGS. 5a through 5c are cross-sectional views of discrete segments of a prior imprint stamp that has been selectively etched to define the prior imprint patterns.
Figure 5B:
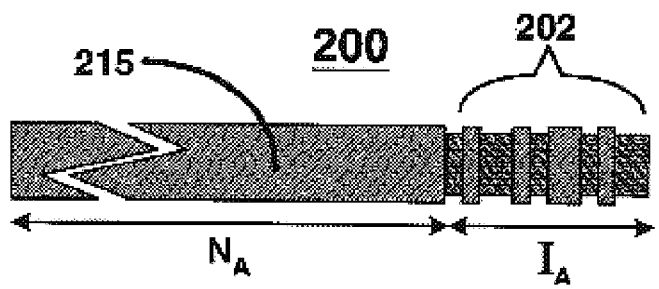
Figure 5C:
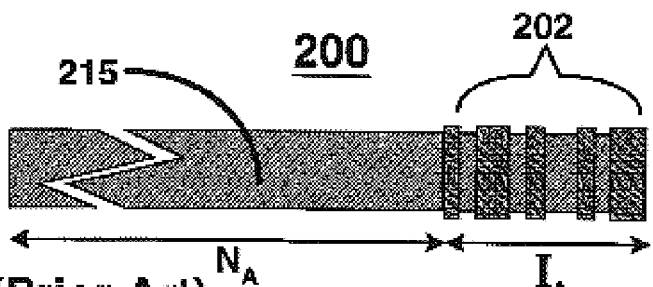
Figure 7C:
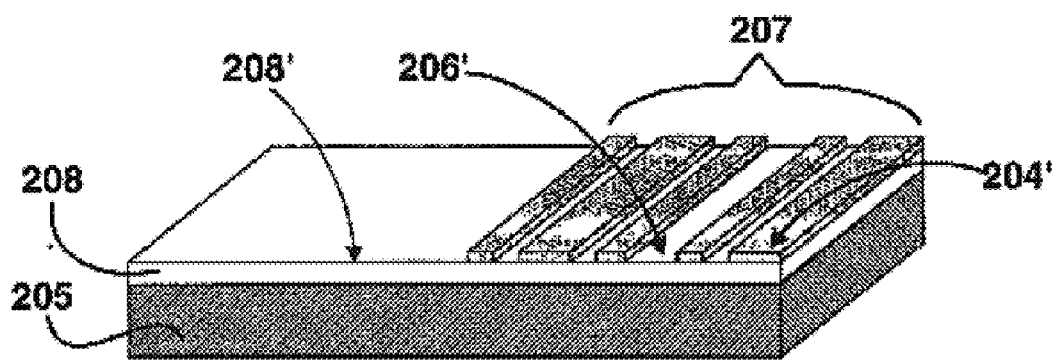
FIGS. 7a through 7d depict a prior process for pressing the prior imprint stamp into the prior mask layer to form nano-size patterns.
Figure 7D:
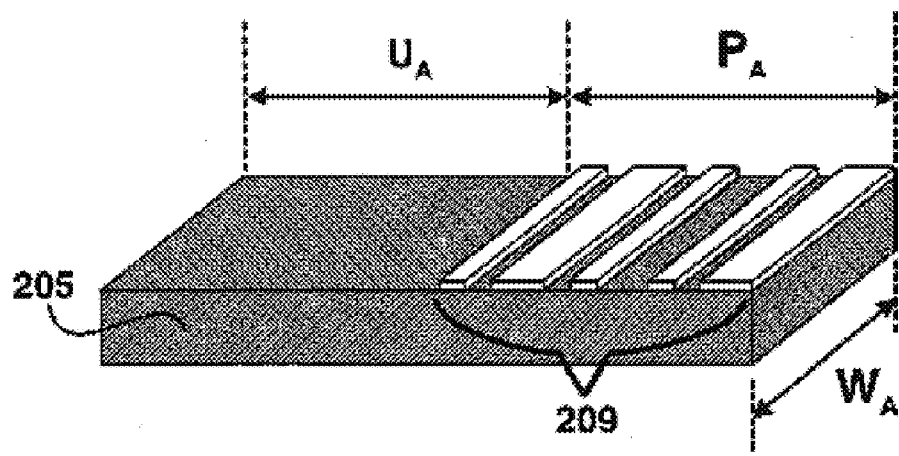
Figure 4B:
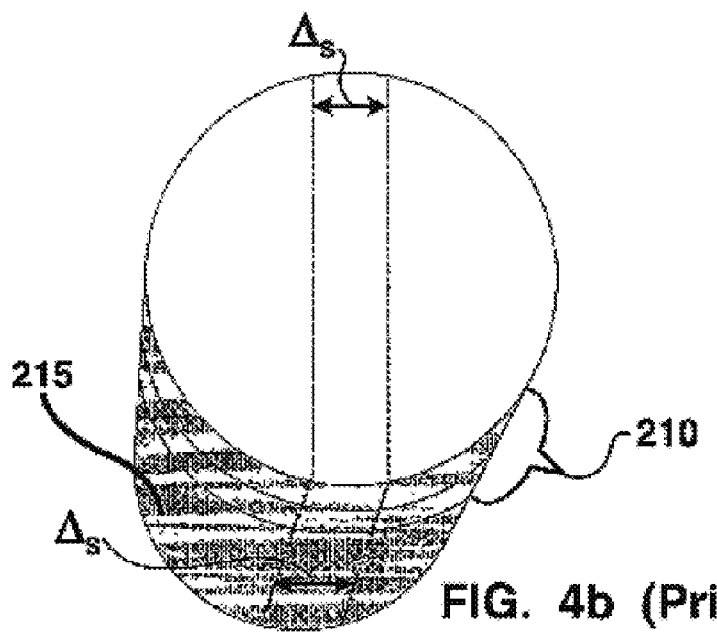
FIG. 4b is a profile view of a prior substrate before the substrate has been sliced into discrete segments.
Figure 6:
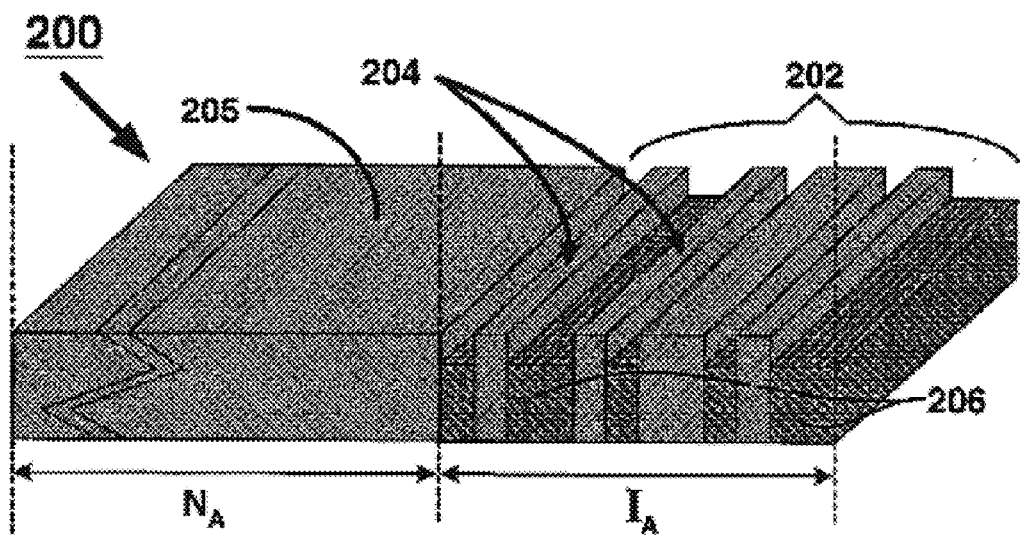
FIG. 6 is a profile view depicting an imprint area and a non-patternable area of the prior imprint stamp.
Figure 7A:
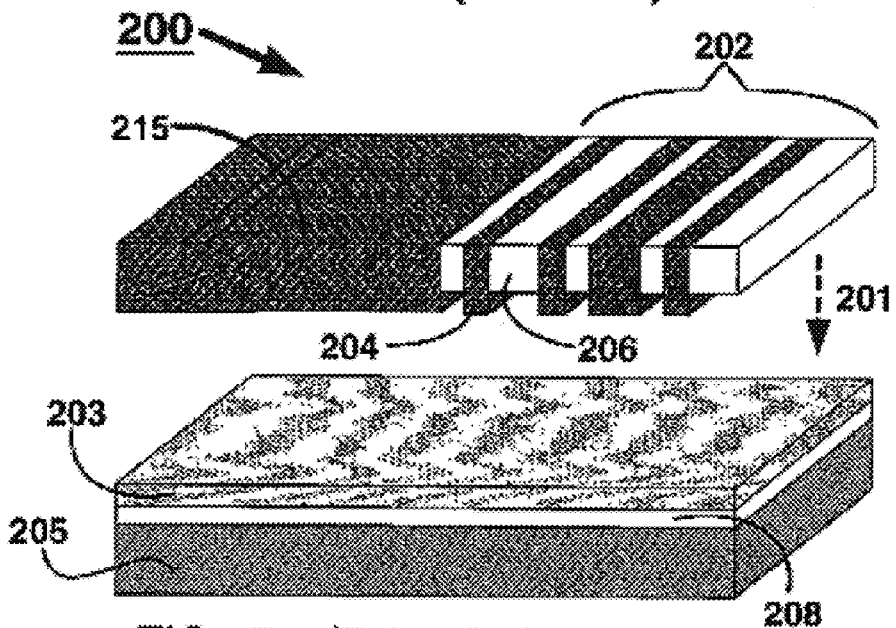
Figure 7B:
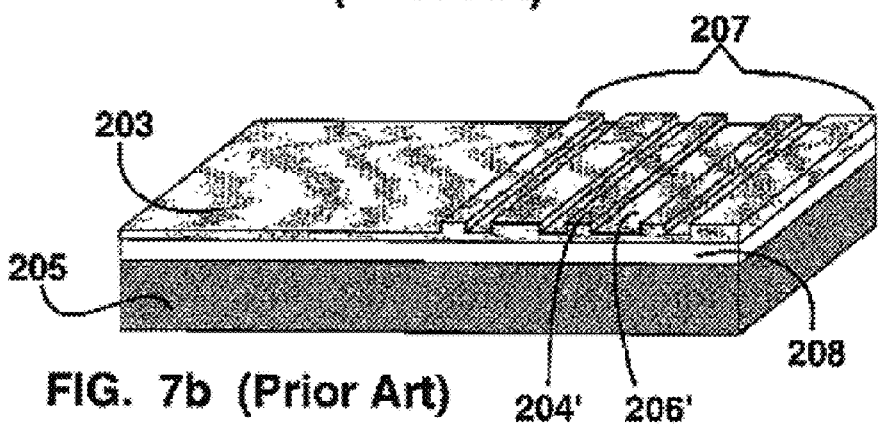

In the following detailed description and in the several figures of the drawings, like elements are identified with like reference numerals.

As shown in the drawings for purpose of illustration, the present invention is embodied in a wide-area nano-size imprinting stamp carried by a substrate including a base surface having a usable area defined thereon. A plurality of imprint stamps are in contact with the base surface and extend outward of the base surface. The imprint stamps are spaced apart from one another and occupy substantially all of the useable area of the base surface. Each imprint stamp has a predetermined shape and includes a micro-feature having side surfaces positioned in opposition to each other and a plurality of spacers formed on the opposed side surfaces and extending outward of the side surfaces. The spacers and the micro-features also extend outward of the base surface and the spacers and the micro-features include a height and width that varies among the spacers and the micro-features to define an imprint profile. The imprint profile can define complex shapes that can be imprinted as a pattern on a mask layer.

Figure 8:
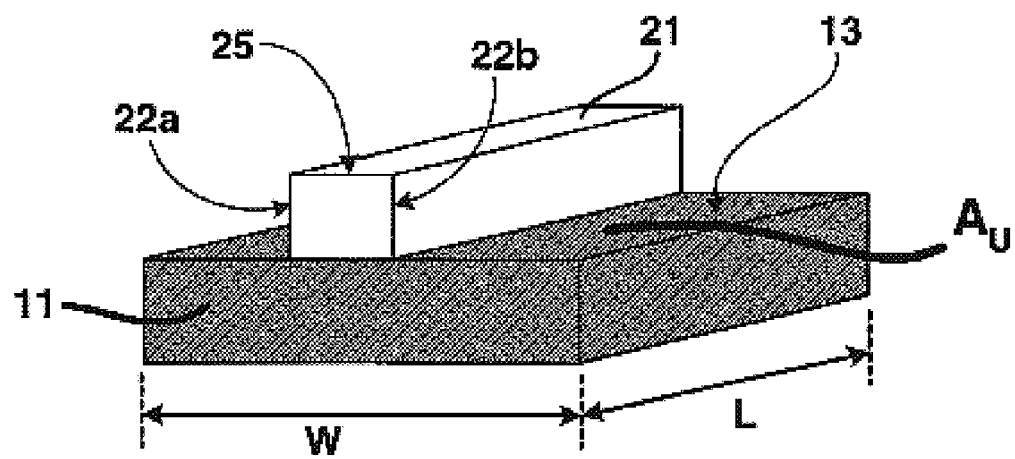
FIG. 8 is a profile view of a micro-feature according to the present invention.

In FIG. 8 a substrate 11 includes a base surface 13 having a usable area $A_U$ defined by a product of a width W and length L of the of the base surface 13 such that the useable area $A_U=W*L$. Although a rectangular shape is illustrated in FIG. 8, the present invention is not limited to that shape and other shapes such as a circular shape, for example, can be used and the useable area $A_U$ can be determined based on the shape selected. For instance, the useable area $A_U$ for a circular shape would be $A_U=2\pi*r^2$. A plurality of imprint stamps 20 are in contact with the base surface 13 and extend outward of the base surface 13 (as will be described below). The imprint stamps 20 are spaced apart from one another and are positioned on the base surface 13 so that the imprint stamps 20 occupy substantially all of the useable area $A_U$.

Figure 10:
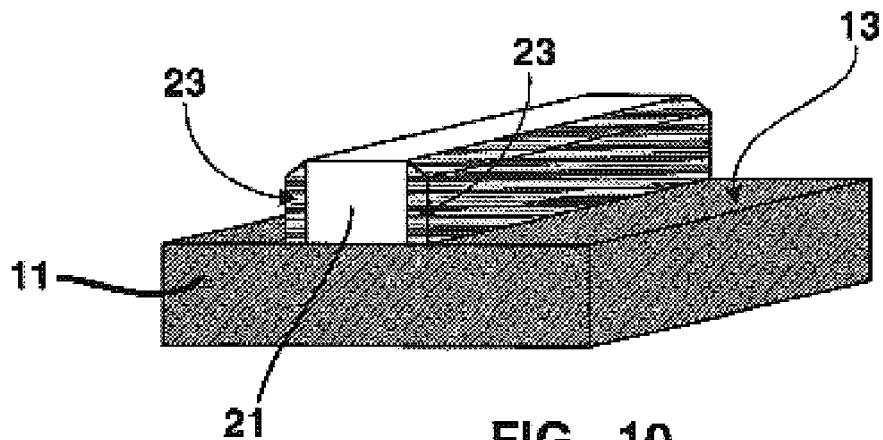
FIG. 10 is a profile view of a spacer formed by selectively etching the spacer layer of FIG. 9 according to the present invention.

In FIGS. 8 and 10, each imprint stamp 20 has a predetermined shape and includes a micro-feature 21 that extends outward of the base surface 13 and including opposed side surfaces (22a, 22b). Each imprint stamp 20 further includes a plurality of spacers 23 (two are shown in FIG. 10) that extend laterally outward of the opposed side surface (22a, 22b) of the micro-feature 21 and the spacers 23 also extend outward of the base surface 13. The micro-feature 21 and the spacers 23 include a height and a width that varies among micro-feature 21 and the spacers 23 to define an imprint profile 24 (as will be described below).

Figure 9:
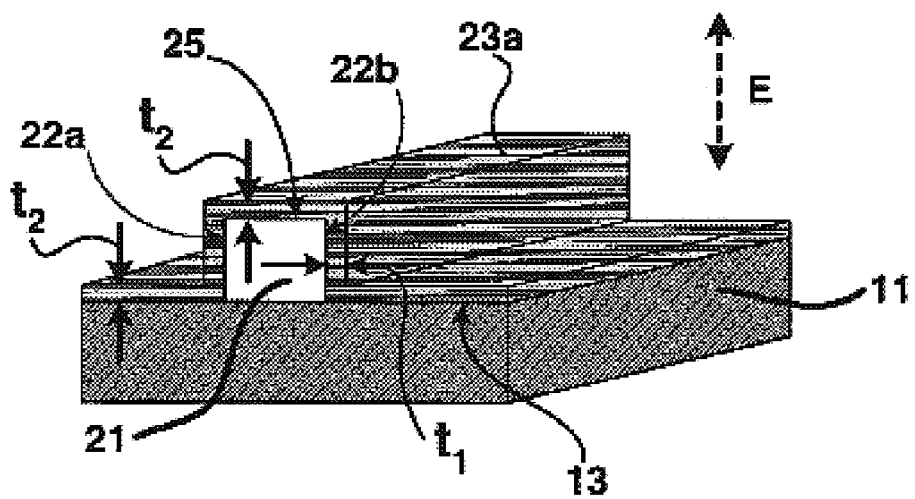
FIG. 9 is a profile view of a spacer layer formed over the micro-feature of FIG. 8 according to the present invention.

In FIG. 9, the spacers 23 can be formed by depositing a material for a spacer layer 23a on the micro-feature 21 and the base surface 13 using deposition processes that are well known in the microelectronics arts, such as chemical vapor deposition (CVD) or atomic layer deposition (ALD), for example. Preferably, the material for the spacer layer 23a is conformally deposited over the micro-feature 21 and the base surface 13 so that a first thickness $t_1$ of the material on the opposed side surface (22a, 22b) is substantially equal to a second thickness $t_2$ of the material on the base surface 13 and a top surface 25 of the micro-feature 21 ($t_1 \approx t_2$). That is, the lateral growth rate of the material is substantially equal to the vertical growth rate of the material. A portion of the spacer layer 23a that is disposed on the top surface 25 and the base surface 13 is removed using a highly selective etch process such as an anisotropic etch, for example, that etches the material at a faster etch rate in a preferred etch direction indicated by dashed arrow E. As a result, the material covering the top surface 25 and the base surface 13 is removed and the material covering the opposed side surface (22a, 22b) remains and forms the spacers 23 as depicted in FIG. 10.

Figure 11A:
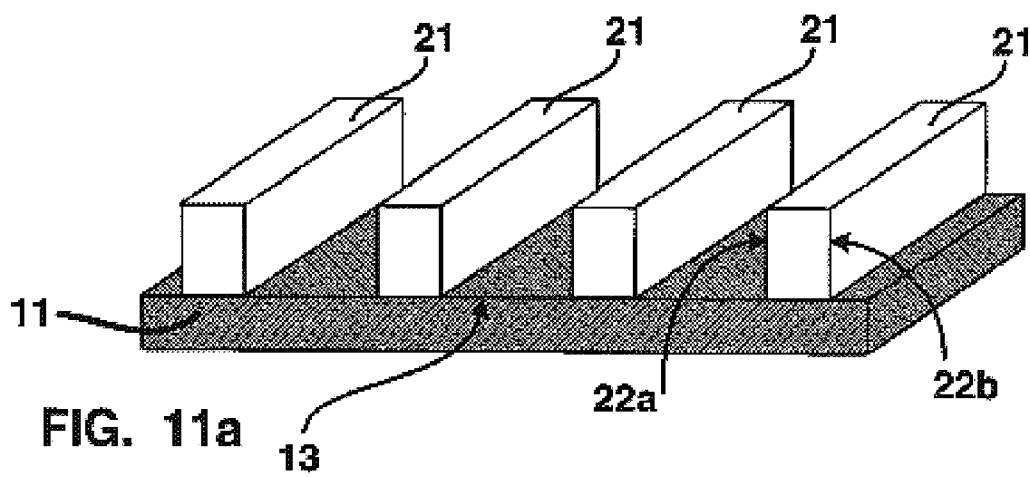
FIGS. 11a through 11f depict a process for forming a wide-area nano-size imprinting stamp according to the present invention.
Figure 11B:
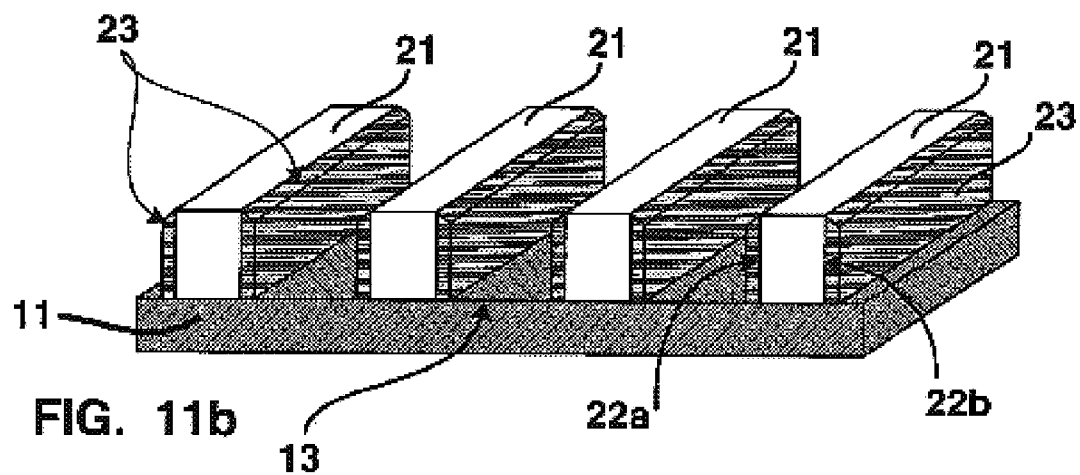

In FIG. 1a, a plurality of micro features 21 are formed on the base surface 13 of the substrate 11. After conformally depositing and then selectively etching a material for the spacers 23, a plurality of spacers 23 are formed on the opposed side surfaces (22a, 22b) as depicted in FIG. 11b.

Figure 11C:
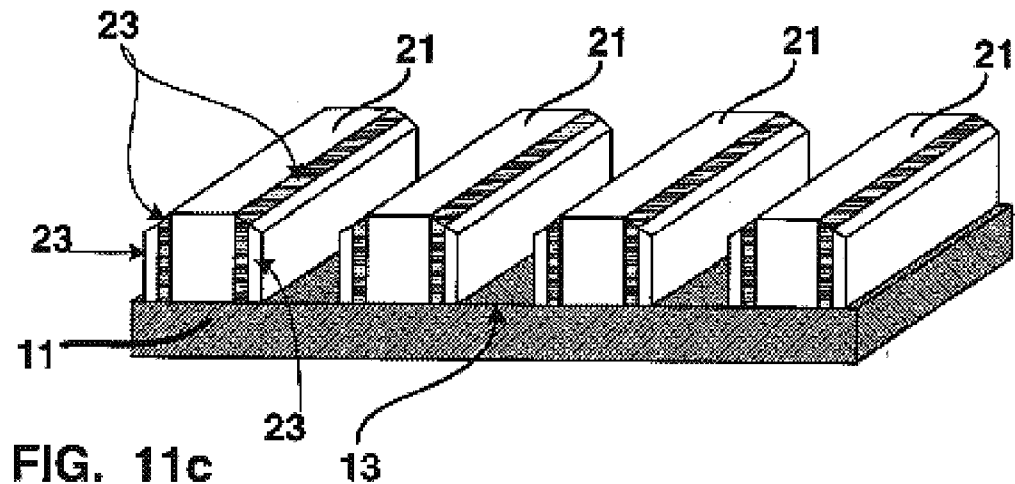
Figure 11D:
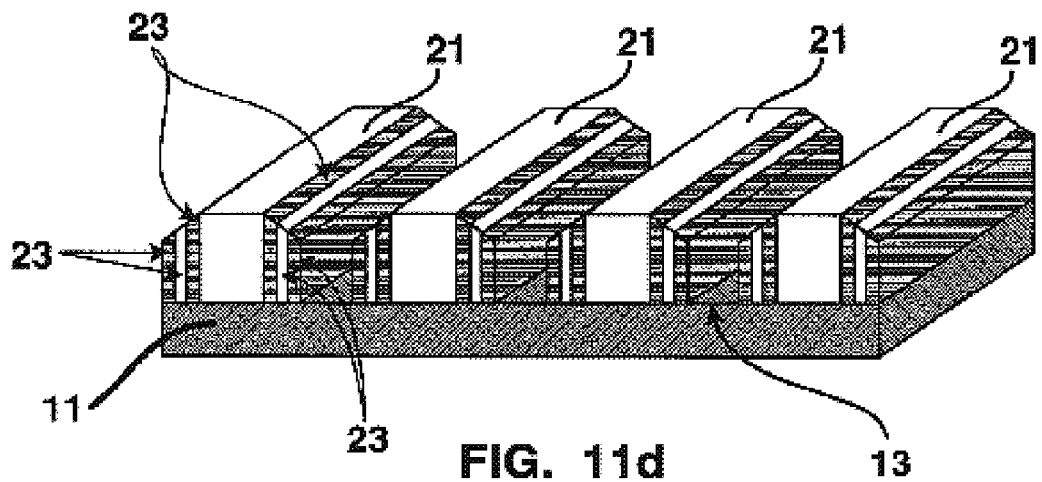

The deposition process can be repeated as necessary to form additional spacers 23 as depicted in FIGS. 11c and 11d. Each deposition step is followed by a selective etch step.

Figure 11E:
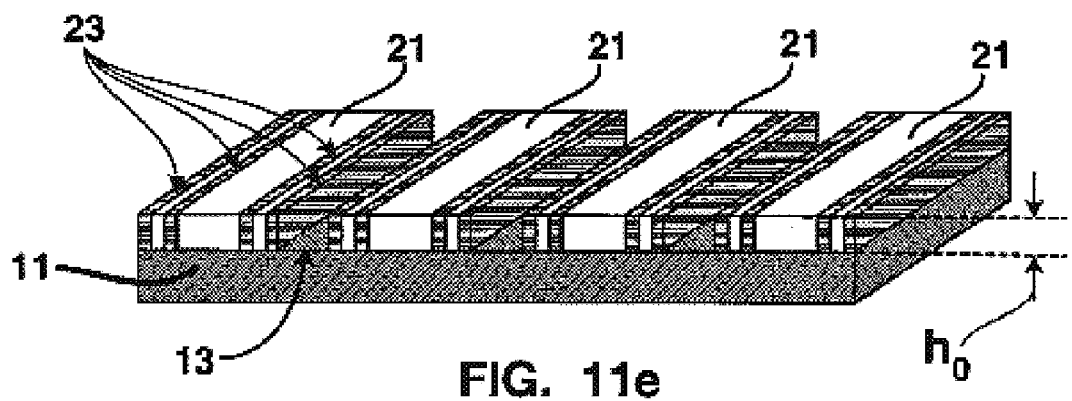

In FIG. 11e, after the desired number of spacers 23 are formed, the plurality of micro-features 21 and their associated spacers 23 are planarized (i.e. made substantially flat) by a planarization process such as chemical mechanical planarization (CMP), for example. After the planarization step, the micro-features 21 and their associated spacers 23 extend outward of the base surface 13 by a substantially uniform height $h_0$.

Figure 11F:
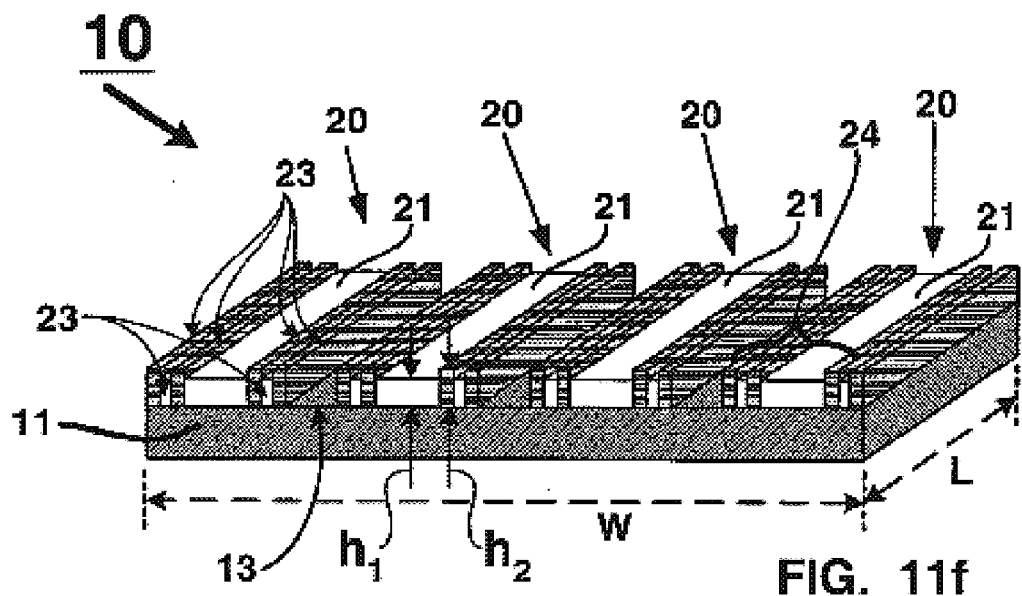

In FIG. 11f, a wide-area nano-size imprinting stamp 10 is formed by selectively etching the micro-features 21 and the spacers 23. For instance, an etchant can be selected to etch only the micro-features 21 such that the height of the micro-features 21 (i.e. the height they extend outward of the base surface 13) decreases with etch time. Consequently, after the etching process, there are variations in height ($h_1$ and $h_2$) between the micro-features 21 and their associated spacers 23. Those variations in height ($h_1$ and $h_2$) define the imprint profile 24 for each imprint stamp 20.

Depending on the materials from which the various spacers 23 and the micro-features 21 are made, an etchant can be selected to etch only one or more of those materials to reduce the height of those materials while not etching those materials that are not targeted by the etchant. As a result, after the etching process, their will be variations in height among the spacers 23 and the micro-features 21 that define the imprint profile 24 of each imprint stamp 20.

The predetermined shape of each imprint stamp 20 is defined by several factors including: the lithographic process used to define the micro-features 21 and the spacers 23; the materials used for the micro-features 21; and the spacers 23 and the etchant and etch processes used to define the imprint profile 24 of each imprint stamp 20. The predetermined shape can be an identical shape among all of the imprint stamps 20, the predetermined shape can vary among all of the imprint stamps 20, or the predetermined shape can be a combination of identical shapes and shapes that vary among all the imprint stamps 20.

Figure 14:
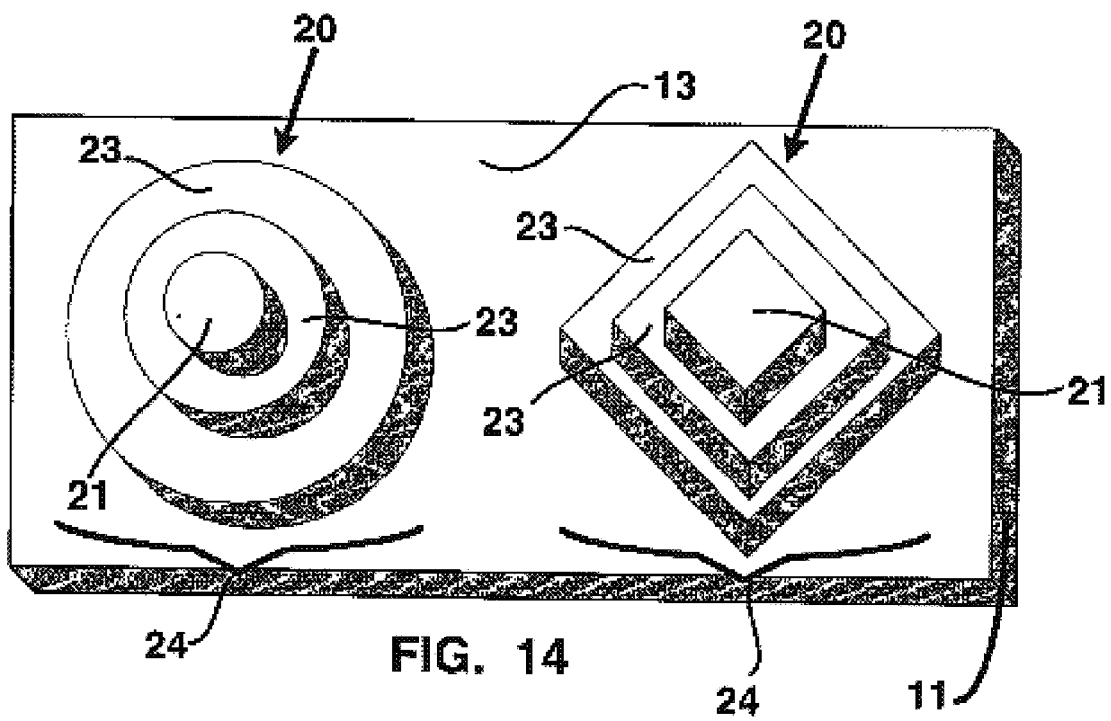
FIG. 14 is a profile view of a wide-area nano-size imprinting stamp formed by selectively etching the micro-features and spacers of FIG. 13c.
Figure 15:
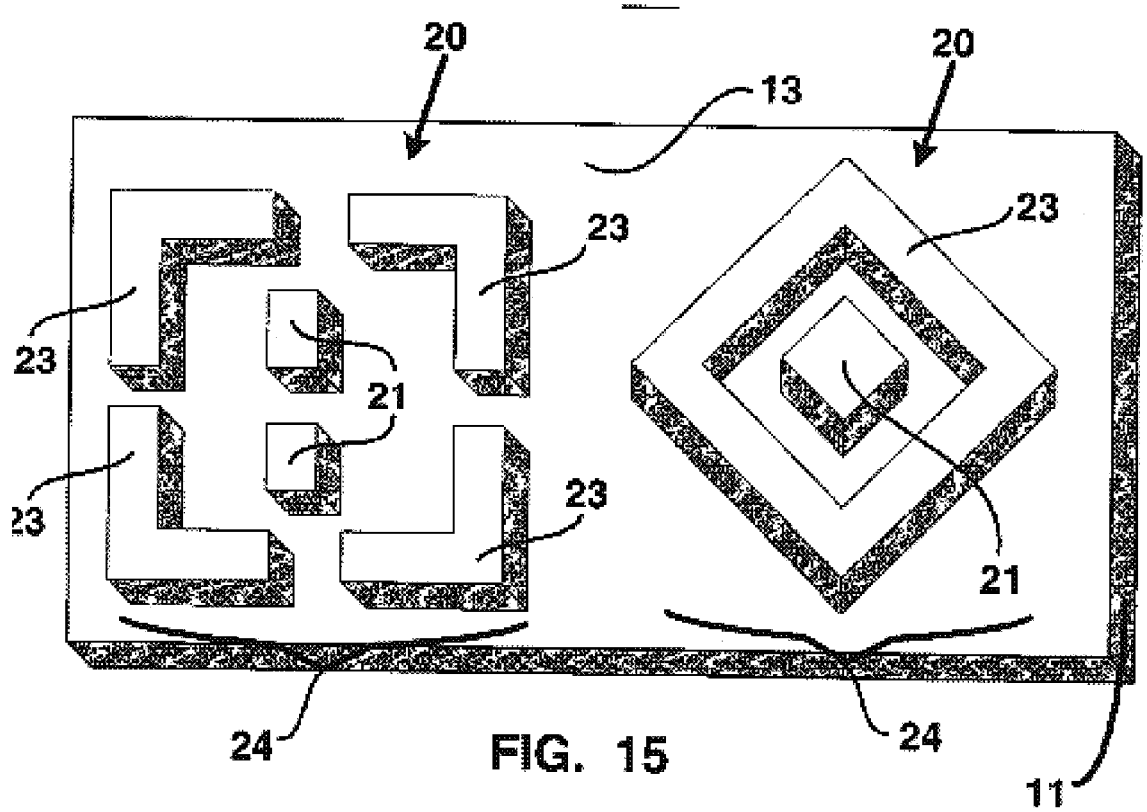
FIG. 15 is a profile view depicting an imprint profile formed by micro-features and spacers having complex shapes according to the present invention.

In FIG. 11f the predetermined shape of the imprint stamps 20 is identical among all of the imprint stamps 20. In contrast, in FIGS. 14 and 15, the imprint stamps 20 have a predetermined shape that varies among all of the imprint stamps 20 (two are shown). As depicted in FIGS. 11f, 14, and 15, the imprint stamps 20 can have imprint profiles 24 that define complex shapes.

Figure 12A:
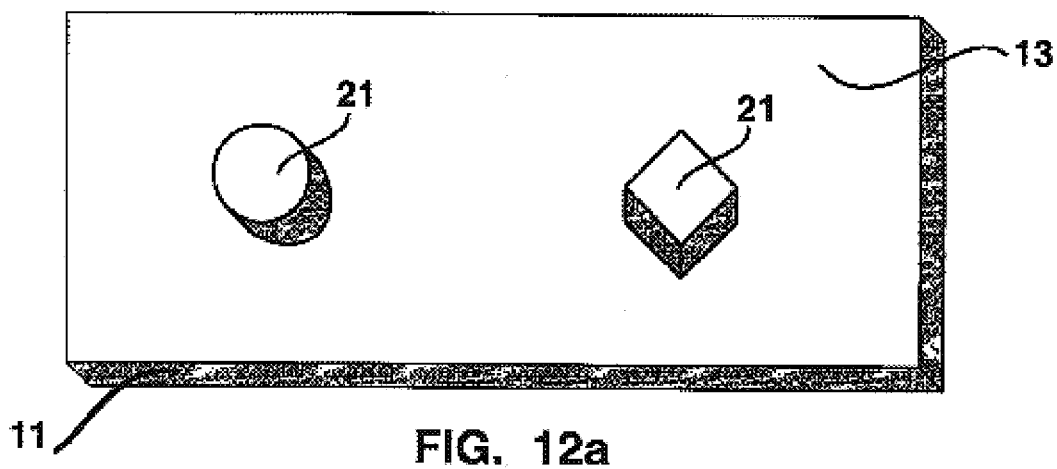
FIGS. 12a through 12c are top profile views of micro-features and spacers having complex shapes according to the present invention.
Figure 12B:
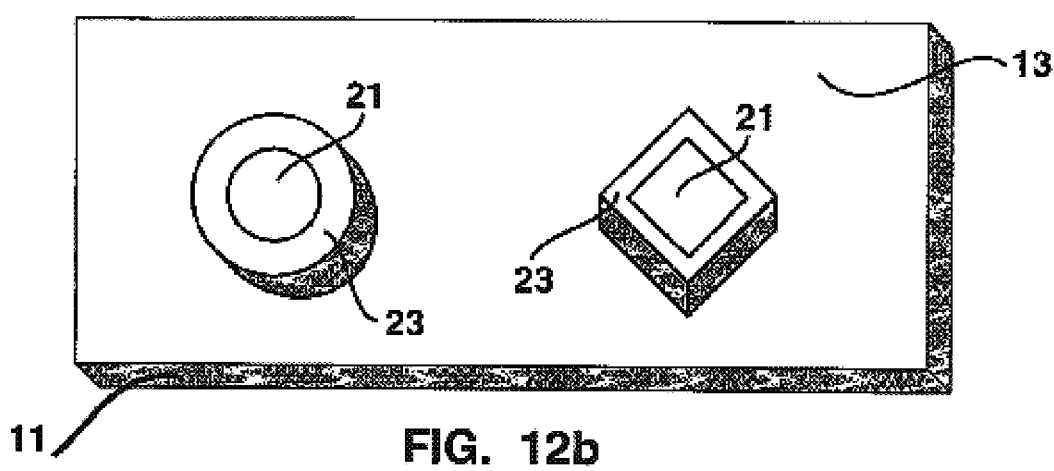
Figure 12C:
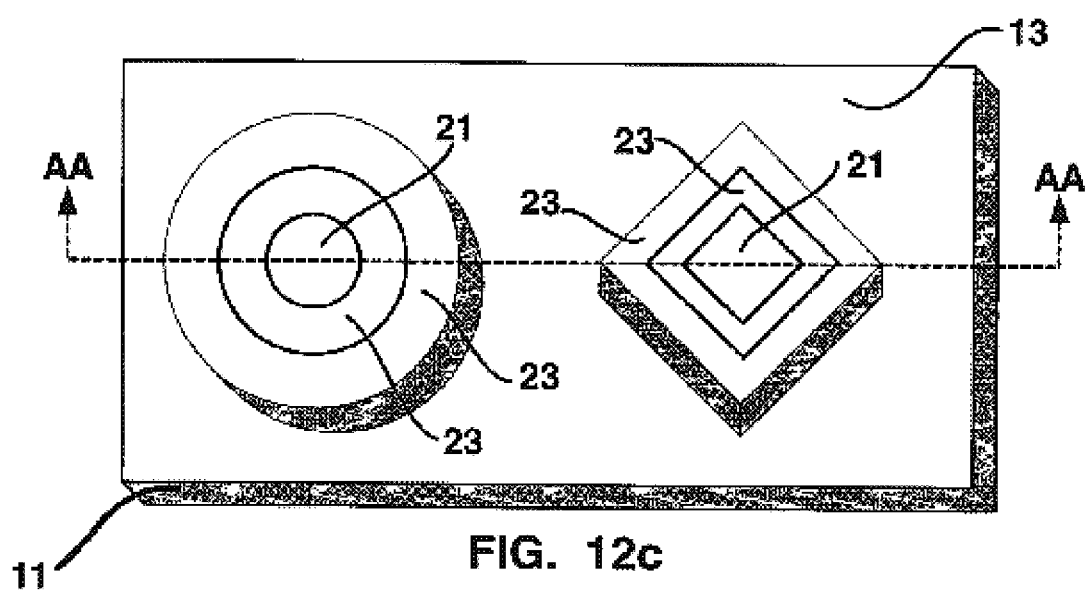

In FIGS. 12a through 12c, the complex shapes for the imprint stamps 20 of FIG. 14 are formed by first depositing the micro-features 21 on the base surface 13. In FIG. 12a the micro-features 21 have a circular shape and a diamond shape; however, those shapes are for purposes of illustration only and the present invention is not to be construed as being limited to only those shapes described herein. Similarly, in FIG. 12b, spacers 23 having a shape that conforms with that of the micro-feature 23 are formed on the base surface 13 and the opposed side surfaces (22a, 22b) (not shown). In FIG. 12c, yet another layer of spacers 23 are formed on the previous layer of spacers 23.

Figure 13A:
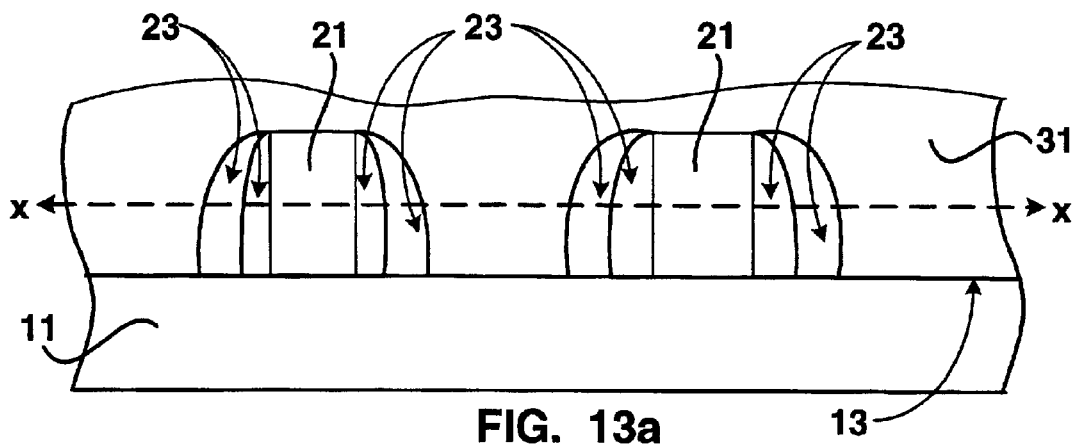
FIGS. 13a through 13c are cross-sectional views that depict a process for forming the micro-features and spacers of FIGS. 12a through 12c.
Figure 13B:
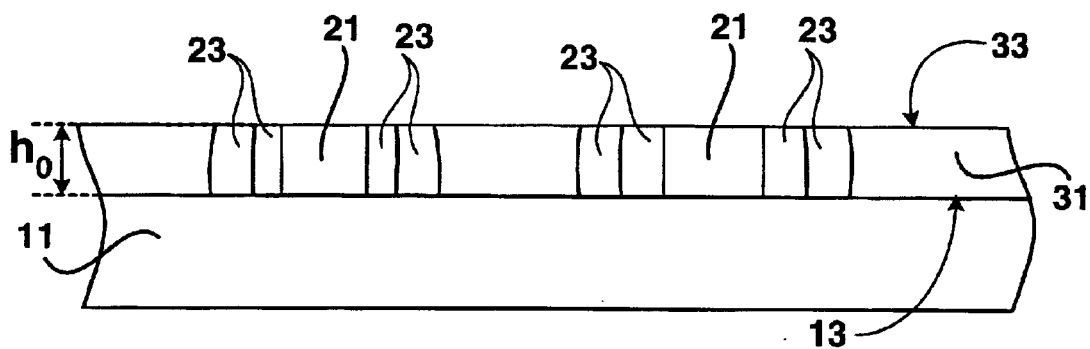
Figure 13C:
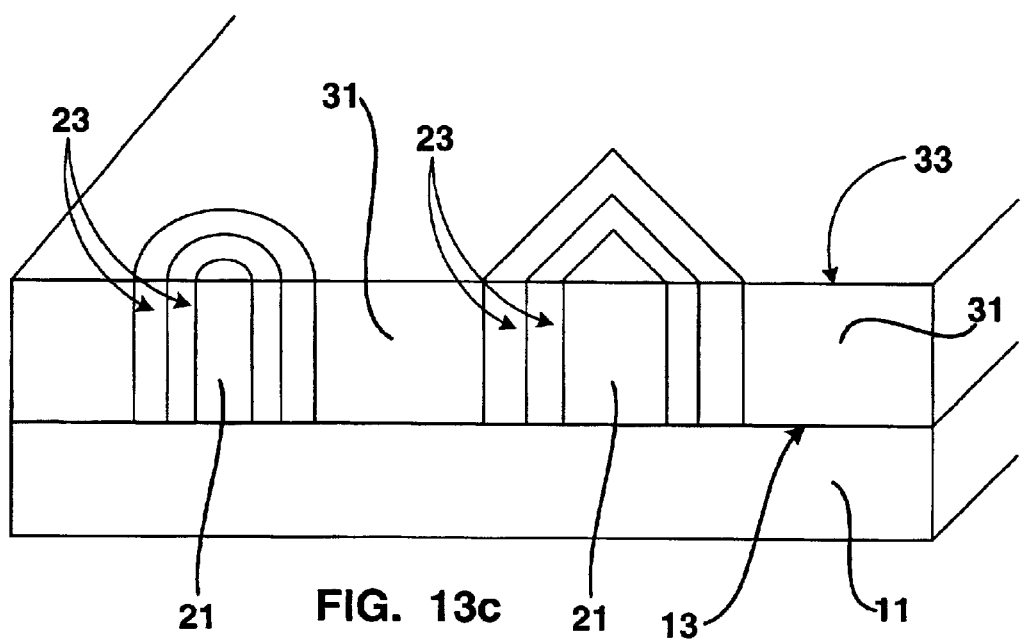

FIGS. 13a through 13c are cross-sectional views taken along dashed line AA of FIG. 12c. In FIG. 13a, a filler layer 31 is disposed between adjacent imprint stamps 20. A planarization step is used to planarize the entire structure such that the filler layer 31, the micro-features 21, and the spacers 23 extend outward of the base surface 13 by the substantially uniform height $h_0$ and define a substantially planar surface as indicated by dashed line X.

In FIG. 14, after one or more selective etching steps, the spacers 23 and the filler layer 31 are etched at a higher etch rate than the micro-features 21 of FIG. 13c, resulting in the micro-features 21 extending furthermost outward of the base surface 13. Additionally, differences in etch rates and materials used for the spacers 23 results in an innermost of the spacers 23 extending outward of the base surface 13 a greater distance than an outermost of the spacers 23. Consequently, the imprint stamps 20 of FIG. 14 have an imprint profile 24 defining concentric circular and concentric rectangular shapes. In FIG. 15, other possible complex shapes for the imprint patterns 20 are illustrated. Lithographic processes and photoresist masks can be used to define complex imprint profiles 24 like those shown in FIG. 15.

Figure 16:
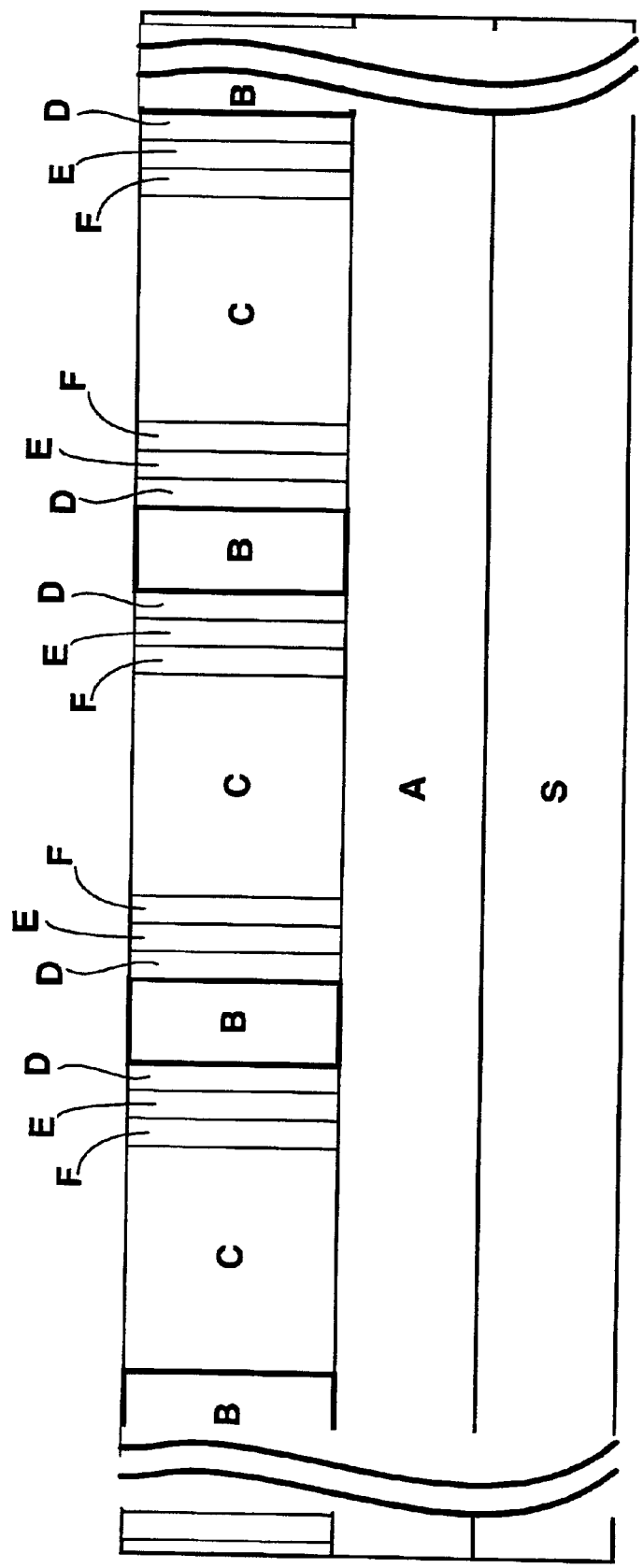
FIG. 16 is a cross-sectional view of various layers of materials that can be used to form a wide-area nano-size imprinting stamp according to the present invention.

FIG. 16 is a cross-sectional view depicting a plurality of micro-features 21 (denoted a B) and spacers 23 (denoted as D, E, & F) formed on a substrate 11 (denoted as A) and planarized. For all the embodiments described herein, a material B for the micro-features 21 and materials D, E, & F for the spacers 23 can be a material including but not limited to those set forth in Table 1 below:

TABLE 1

Materials for the micro-feature 21 and the spacers 23

Silicon Oxide ($SiO_2$)
Silicon Nitride ($Si_3N_4$)
Polysilicon
A Metal
Silicon Oxynitride ($Si_2N_2O$)
Silicon Carbide (SiC)
Diamond like Carbon
A Silicide In FIG. 16, the layers of materials D, E, & F for the spacers 23 alternate such that the materials for D, E, & F can be different materials or the same materials. For instance, D, E, & F can be identical materials that are doped with different impurities to alter their respective etch rates.

Optionally, a filler layer 31 (denoted as C) can be disposed between adjacent imprint stamps 20. The filler layer 31 can be a material including but not limited to those set forth in Table 2 below:

TABLE 2

Materials for the filler layer 31

Tetraethylorthosilicate (TEOS)
A Boron (B) doped Tetraethylorthosilicate (BSG)
A Phosphorus (P) doped Tetraethylorthosilicate (PSG)
A Boron (B) and Phosphorus (P) doped Tetraethylorthosilicate (BPSG)

The substrate 11 (denoted as A) can be made from a material including but not limited to those set forth in Table 3 below:

TABLE 3

Materials for the substrate 11

A Glass
PYREX ™ (borosilicate glass)
Silicon Oxide ($SiO_2$)
Aluminum Oxide ($Al_2O_3$)
Indium Phosphide (InP)
A Semiconductor Material
Silicon (Si)

Optionally, the substrate 11 (denoted as A) can be formed on a supporting substrate S. For instance, the substrate 11 can be a layer of silicon oxide ($SiO_2$) and the supporting substrate S can be a semiconductor material as silicon (Si). For example, the supporting substrate S can be a wafer of single crystal silicon (Si).

As was noted above, the imprint stamps 20 can occupy substantially all of the useable area $A_U=W*L$. However, in some instances it may be desirable or necessary for the imprint stamps to occupy an area that is less than substantially all of the useable area $A_U$. In FIGS. 18a and 18b, the imprint stamps 20 occupy an area $A_P$ that is less than the useable area $A_U$. In FIG. 18a the substrate 11 has a rectangular shape and in FIG. 18b the substrate 11 has a circular shape. In either case, the area $A_P$ leaves a portion of the substrate 11 unoccupied and that unoccupied area can be used to physically handle the substrate 11 during microelectronic fabrication of the wide-area nano-size imprinting stamp 10.

In FIG. 19a, the wide-area nano-size imprinting stamp 10 can be formed on a plurality of die 50 that are formed on the substrate 11. The die 50 are spaced apart from one another in a manner similar to die used in the manufacture of semiconductor devices such as an ASIC, wherein the spaces between adjacent die define scribe marks that are used in sawing the substrate into individual die. For instance, if the substrate 11 is a wafer of silicon (Si), then the wafer is sawed along the scribe lines to separate the individual die 50 from the wafer.

A die 50 denoted by dashed lines dd is shown in greater details in FIG. 19b where the die 50 has a die area defined as the product of $W_D*L_D$ and the imprint stamps 20 occupy a sub-area $A_P$ that can be substantially all of the die area (i.e. $W_D*L_D$) or can be less than die area. In FIG. 19b the sub-area $A_P$ is less than the die area ($W_D*L_D$).

The wide-area nano-size imprinting stamp 10 can be formed using well understood microelectronics processing techniques. In FIGS. 21a through 21d, The micro-features 21 can be formed by depositing a feature layer 21a on the useable area $A_U$ of the base surface 13 of the substrate 11. The feature layer 21a can then be lithographically patterned 27 and then dry etched to define a plurality of the micro-features 21 having a top surface 25 and opposed side surfaces (22a, 22b).

Next, a spacer layer 23a is conformally grown on the micro-features 21 until the spacer layer 23a has a desired thickness ($t_1$, $t_2$) that is substantially equal on the top surface 25 and the opposed side surfaces (22a, 22b) (that is $t_1 \approx t_2$) (see reference numeral 23a in FIG. 9). A process such as CVD can be used for the conformal growth of the spacer layer.

The spacer layer 23a is anisotropically etched to remove a portion of the spacer layer 23a that is disposed on the top surface 25 thereby defining a plurality of imprint stamps 20 that include a plurality of spacers 23 disposed on the opposed side surfaces (22a, 22b) of the micro-features 21. A highly selective wet or dry etching process can be used for the anisotropic etch step.

The conformal growing step and the anisotropically etching step are repeated as necessary to define additional spacers 23 on the imprint stamps 20. After completing the conformal growing and the anisotropic etching steps, the imprint stamps 20 are planarized so that the micro-features 21 and the spacers 23 extend outward of the base surface by a substantially identical height $h_0$. A process such as CMP can be used for the planarization step.

A selected one or more of the micro-features 21 and the spacers 23 are selectively etched to define the imprint profile 24 in the imprint stamps 20. The selective etch process is repeated as necessary to selectively etch a selected one or more of the micro-features 21 and the spacers 23 to further define the imprint profile 24. A wet or dry anisotropic etch process can be used to selectively etch the micro-features 21 and the spacers 23.

Prior to the above mentioned planarization step, a filler layer 31 can be deposited over the imprint stamps 20. The filler layer 31 completely covers the imprint stamps 20. After depositing the filler layer 31, the planarization step is used to planarize the imprint stamps 20 and the filler layer 31 so that the micro-features 21, the spacers 23, and the filler layer 31 extend outward of the base surface 13 by the substantially identical height $h_0$. After the planarization step, the filler layer 31 can be selectively etched until the filler layer 31 reaches a predetermined thickness $t_f$. That is, the filler layer 31 is etched until it is recessed below the substantially identical height $h_0$ (see FIG. 20).

Figure 22:
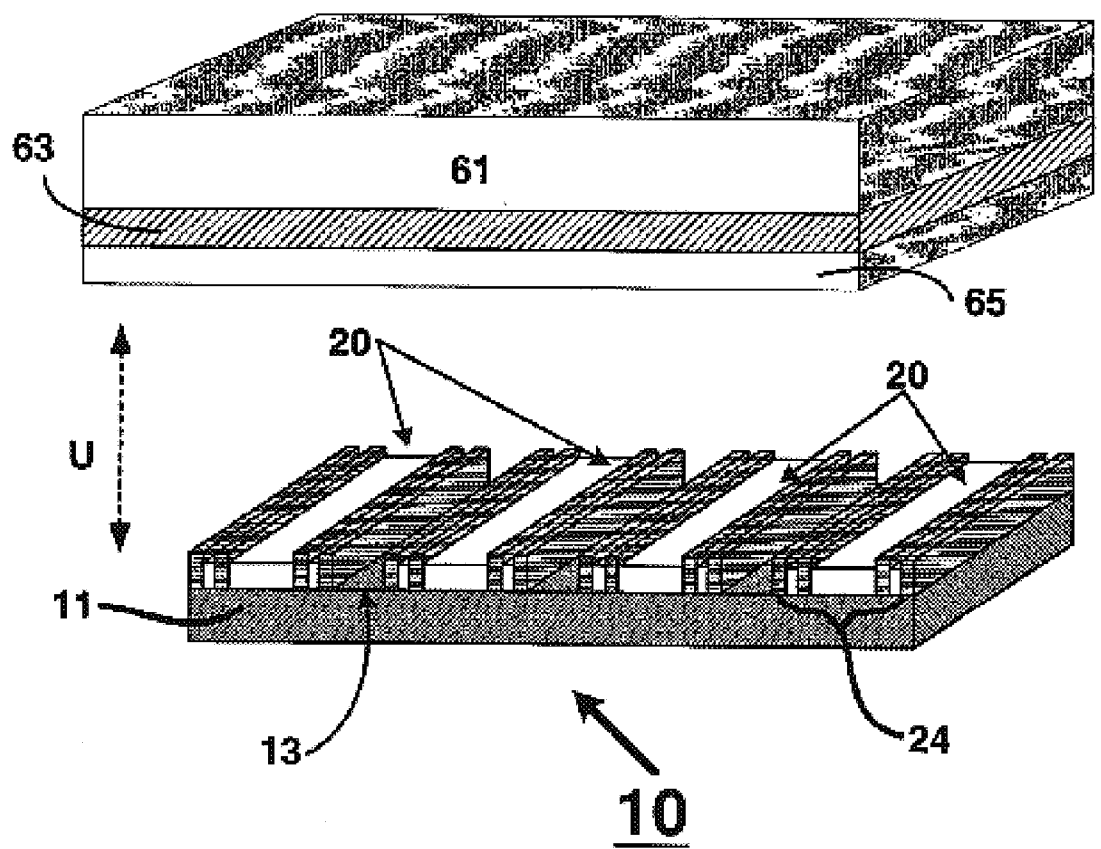
FIG. 22 is a profile view of a wide-area nano-size imprinting stamp and a mask layer being urged into contact with each other to transfer an imprint profile to the mask layer according to the present invention.

In FIG. 22, the wide-area nano-size imprinting stamp 10 is urged into contact (see dashed arrow U) with a mask substrate 61 that carries a film layer 63 and a mask layer 65. For example, the mask layer 65 can be a photoresist material such as PMMA that will deform and conform to the imprint profiles 24 of the imprint stamps 20 when the wide-area nano-size imprinting stamp 10 and the mask substrate 61 are pressed U into contact with each other. In subsequent processing steps, the mask layer can be etched to transfer the imprint patterns formed therein by the imprint profiles 24 to the underlying film layer 63.

In FIG. 17, an example of one method for making the wide-area nano-size imprinting stamp 10 using the spacer technique includes using a process that is similar to a microelectronic process for forming an n-gate for a lightly doped drain (LDD) of a metal oxide semiconductor transistor (MOS). The substrate 11 can be a silicon (Si) substrate upon which a thin gate dielectric layer 41 is deposited on the base surface 13. The gate dielectric layer 41 can be silicon dioxide ($SiO_2$), for example. Next, a gate electrode denoted as g is formed on the gate dielectric layer 41 and the gate electrode g forms the micro-feature 21. A material such as polysilicon can be used to form the micro-feature 21, for example. After forming the micro-feature 21, a spacer layer 23a can be conformally deposited over the micro-feature 21 and then anisotropically etched to form the spacers 23. A material such as silicon nitride ($Si_3N_4$) can be used for the spacer layer 23a, for example. A process such a CVD can be used to conformally deposit the spacer layer 23a.

In FIG. 17, a conformal deposition step followed by an anisotropic etch step is repeated twice to define two spacers 23 extending outward of the opposed side surfaces of the micro-feature 21. The actual number of spacers 23 will be determined by the number of conformal deposition steps and the number of anisotropic etch steps.

The micro-features 21 can have a dimension $t_0$ that can be determined in part by a lithographic process and an etching process used to define the micro-features 21. For instance, the dimension $t_0$ can be about 0.10 $\mu$m. Similarly, the spacers 23 can have dimensions $t_1$ and $t_2$ that can be identical or can vary among the spacers 23. For example, the dimensions $t_1$ and $t_2$ can be about 0.010 $\mu$m. After the aforementioned planarization step, the variations in height among the spacers 23 and the micro-features 21 will be determined by their respective materials and the anisotropic etch processes that the spacers 23 and the micro-features 21 are subjected to. The dimensions for $t_0$, $t_1$, and $t_2$ are not limited to the values set forth herein and the actual dimensions for $t_0$, $t_1$, and $t_2$ will be application dependent.

For purposes of illustration only, a source s and a drain d can be formed in the substrate 11 and can include a lightly doped region 43 and a heavily doped region 45. In a typical LDD process, the lightly doped region 43 would be formed by implanting a light dose of a dopant into the substrate 11 using the gate electrode g as a mask. Next, after the formation of the spacer 23, the heavily doped region 45 would be formed by implanting a heavy dose of a dopant into the substrate 11 using the spacer 23 as a mask.

However, the above mentioned steps for forming the lightly doped region 43 and a heavily doped region 45 are not necessary for making the wide-area nano-size imprinting stamp 10 using the spacer technique and can be eliminated entirely. The gate dielectric layer 41 is optional and can also be eliminated. The micro-features 21 and the spacers 23 can be formed without the implantation steps and the above description of the LDD process serves only to illustrate how microelectronics fabrication techniques that are well understood by those skilled in the microelectronics art (e.g a CMOS process) can be adapted to form the wide-area nano-size imprinting stamp 10 using the spacer technique of the present invention.

Although several embodiments of the present invention have been disclosed and illustrated, the invention is not limited to the specific forms or arrangements of parts so described and illustrated. The invention is only limited by the claims.

What is claimed is:

1. A wide-area nano-size imprinting stamp, comprising:
   a substrate including a base surface having a usable area;
   a plurality of imprint stamps in contact with the base surface and extending outward therefrom, the imprint stamps are spaced apart from one another and the imprint stamps are positioned so that they occupy substantially all of the usable area,
   each imprint stamp has a shape and includes a micro-feature having opposed side surfaces and a plurality of spacers extending laterally outward of the opposed side surfaces,
   the micro-feature and the spacers extend outward of the base surface and the micro-feature and the spacers include a height and a width that varies among the micro-feature and the spacers to define an imprint profile.

2. The wide-area nano-size imprinting stamp as set forth in claim 1, wherein the shape is a shape selected from the group consisting of a shape that is identical among all of the imprint stamps, a shape that varies among all of the imprint stamps, and a combination of shapes that are identical and shape that vary among all of the imprint stamps.

3. The wide-area nano-size imprinting stamp as set forth in claim 1, wherein the micro-feature is made from a material selected from the group consisting of silicon oxide, silicon nitride, polysilicon, a metal, silicon oxynitride, silicon carbide, diamond like carbon, and a silicide.

4. The wide-area nano-size imprinting stamp as set forth in claim 1, wherein the spacer is made from a material selected from the group consisting of silicon oxide, silicon nitride, polysilicon, a metal, silicon oxynitride, silicon carbide, diamond like carbon, and a silicide.

5. The wide-area nano-size imprinting stamp as set forth in claim 1, wherein the substrate is made from a material selected from the group consisting of a glass, borosilicate glass, silicon oxide, aluminum oxide, and indium phosphide.

6. The wide-area nano-size imprinting stamp as set forth in claim 1, wherein the substrate is a semiconductor material.

7. The wide-area nano-size imprinting stamp as set forth in claim 6, wherein the semiconductor material is silicon.

8. The wide-area nano-size imprinting stamp as set forth in claim 1 and further including a filler layer disposed between adjacent imprint stamps.

9. The wide-area nano-size imprinting stamp as set forth in claim 8, wherein the filler layer is a material selected from the group consisting of a tetraethylorthosilicate, a boron doped tetraethylorthosilicate, a phosphorous doped tetraethylorthosilicate, and a boron and phosphorous doped tetraethylorthosilicate.

10. The wide-area nano-size imprinting stamp as set forth in claim 1, wherein the imprint stamps occupy an area that is less than substantially all of the usable area.

11. The wide-area nano-size imprinting stamp as set forth in claim 10, wherein the area is partitioned into a plurality of die, the die are spaced apart from one another, each die including a die area, and within each die the imprint stamps occupy a sub-area selected from the group consisting of substantially all of the die area and less than the die area.

12. A method of forming a wide-area nano-size imprinting stamp, comprising:
   depositing a feature layer on an usable area of a base surface of a substrate;
   patterning and then dry etching the feature layer to define a plurality of micro-features having a top surface and opposed side surfaces;
   conformally growing a spacer layer on the micro-features until the spacer layer has a desired thickness that is substantially equal on the top and opposed side surfaces;
   anisotropically etching the spacer layer to remove a portion of the spacer layer that is disposed on the top surface to define a plurality of imprint stamps that include a plurality spacers disposed on the opposed side surfaces of their respective micro-features;

repeating the conformal growing and the anisotropically etching steps as necessary to define additional spacers on the imprint stamps;

planarizing the imprint stamps so that the micro-features and the spacers extend outward of the base surface by a substantially identical height; and selectively etching a selected one or more of the spacers and micro-features to define an imprint profile in the imprint stamps; and repeating the selectively etching step as necessary to selectively etch a selected one or more of the spacer and micro-features to further define the imprint profile of the imprint stamps.

13. The method as set forth in claim 12 and further comprising prior to the plananzing step, depositing a filler layer that completely covers the imprint stamps, followed by the planarizing step to planarize the imprint stamps and the filler layer so that the micro-features, the spacers, and the filer layer extend outward of the base surface by a substantially identical height.

14. The method as set forth in claim 13 wherein the selectively etching step includes selectively etching the filler layer until the filler layer is recessed below the substantially identical height.

* * * * *